United States Patent [19]

Stoll

[11] 4,084,202

[45] Apr. 11, 1978

[54] COMBINATION STARTER-PROTECTOR DEVICE, METHOD OF PROTECTING A DYNAMOELECTRIC MACHINE, AND CIRCUIT

[75] Inventor: Donald H. Stoll, Morrison, Ill.

[73] Assignee: General Electric Company, Fort Wayne, Ind.

[21] Appl. No.: 693,409

[22] Filed: Jun. 7, 1976

Related U.S. Application Data

[63] Continuation of Ser. No. 508,457, Sep. 23, 1974, abandoned.

[51] Int. Cl.² .............................................. H02H 7/08
[52] U.S. Cl. ....................................... 361/24; 361/27; 361/29; 318/221 H; 318/473
[58] Field of Search ................. 317/13 C, 13 B, 13 A, 317/13 R, 41; 318/221 H, 221 C, 221 B, 221 A, 471, 472, 473; 361/22 R; 337/102, 107, 100; 361/24, 26, 27, 28, 29, 31, 32

[56] References Cited

U.S. PATENT DOCUMENTS

| 2,771,528 | 11/1956 | Moran | 200/122 |
|---|---|---|---|
| 3,434,089 | 3/1969 | Waseleski, Jr. et al. | 337/107 X |
| 3,695,054 | 10/1972 | Barry | 318/473 |

Primary Examiner—J. D. Miller
Assistant Examiner—Patrick R. Salce
Attorney, Agent, or Firm—Joseph E. Papin

[57] ABSTRACT

A method of protecting auxiliary winding means and main winding means in a winding circuit of a dynamoelectric machine in the event of a current overload. In this method, means is actuated in response to a preselected thermal condition accompanying the current overload for interrupting the winding circuit. Heat is transmitted from means for controlling starting of the dynamoelectric machine to the interrupting means for generally maintaining the winding circuit effectively interrupted for at least a predetermined period, and the starting controlling means is operable generally in response to current flow therethrough to increase its resistance generally as a function of its temperature for impeding the current flow therethrough to the auxiliary winding means at a preselected speed of the dynamoelectric machine.

A combination starter-protector device, a method of operating a dynamoelectric machine, and a circuit are also disclosed.

57 Claims, 8 Drawing Figures

COMBINATION STARTER-PROTECTOR DEVICE, METHOD OF PROTECTING A DYNAMOELECTRIC MACHINE, AND CIRCUIT

CROSS REFERENCE TO RELATED APPLICATION

This patent application is a continuation of patent application Ser. No. 508,457 filed Sept. 23, 1974 and now abandoned, the contents of which are specifically incorporated herein by reference.

BACKGROUND OF THE INVENTION

This invention relates generally to dynamoelectric machines and in particular to a combination starter-protector device therefor, a method of protecting a dynamoelectric machine, a method of operating a dynamoelectric machine, and a circuit.

In the past, various devices and methods have been employed to start a dynamoelectric machine, such as a split phase electric motor for instance, and also to protect the windings thereof in the event of the occurrence of an overload condition which, of course, may have had the deleterious effect of destroying or burning out such windings.

In one such particular past protector device, a positive temperature coefficient resistor (hereinafter referred to as a PTCR) was connected serially with a start or auxiliary winding of a split phase type motor. Upon energization of the motor with the PTCR at a low temperature, sufficient current was passed by the PTCR to energize the start winding thereby to assist in the energization of the motor. Of course, as well known in the art, the PTCR is self-heating upon energization wherein the resistance of the PTCR is increased generally as a function of its increasing temperature. Therefore, at elevated temperatures of the PTCR, it acted to limit passage of current applied therethrough to the start winding to an acceptable minimum value which, in effect, electrically disassociated the start winding from circuit relation with the run or main windings of the motor generally upon the motor attaining its preselected running speed. Of course, one of the disadvantageous or undersirable features of employing a PTCR as a starting resistor is believed to be the time required, after the motor was de-energized or turned-off, for the PTCR to cool sufficiently in order to restart the motor. In some instances, at least one or two minutes may have been necessary to cool the PTCR to a temperature value at which it may pass sufficient current to effect motor restarting.

Another disadvantageous or undesirable feature of at least some of the past protector devices employed with small motors (such as those which may be used to operate refrigerators, freezers or other appliances or the like) is believed to be that they did not have sufficient "off" time to allow the PTCR to cool for restarting the motor when the motor was subjected to a locked rotor condition for instance. A high current draw is encountered under locked rotor conditions, and during the "on" cycle of the protector device, the temperature of the PTCR would, of course, increase. However, when so subjected to such locked rotor condition, the protector device was responsive to the relatively high current draw to revert to its "off" cycle. In the "off" cycle, the protector device was operable generally to electrically isolate the motor windings to prevent short circuiting or burning out thereof. With the windings so isolated from the high current draw, the protector components would cool sufficiently to allow cycling thereof to the "on" cycle which again permitted high current drawn through the windings. In this manner, the motor was cycled continuously by the protector device under locked rotor or high current draw condition which, of course, is believed to be totally undesirable.

In some instances, attempts were made to utilize a PTCR as a starting resistor in various appliances by, whenever possible, placing the protector device on the motor windings and within the housing of a compressor for driving the appliance. Of course, the increased temperature at the protector device within the compressor increased the "off" time to an acceptable value which would permit motor restarting. However, at least one of the disadvantageous or undesirable features of this scheme is believed to be that the cost of installing the protector device within the compressor housing more than offset any savings which may be gleaned by using a PTCR as a starting resistor in the motor circuit rather than a more conventional motor starting relay.

SUMMARY OF THE INVENTION

Among the several objects of the present invention may be noted the provision of an improved combination starter-protector device for a dynamoelectric machine, an improved method for protecting a dynamoelectric machine, an improved method of operating a dynamoelectric machine, and an improved circuit which overcome the aforementioned disadvantageous or undesirable features, as well as others, which were discussed hereinbefore with respect to the prior art; the provision of such combination starter-protector device, such methods, and such circuit in which the temperature effected by components of the protector portion of the combination starter-protector device during an overload condition is supplemented for dynamoelectric machine starting purposes; the provision of such combination starter-protector device, such methods and such circuit in which heat is transferred between the components of such combination device in general by radiation, the provision of such combination starter-protector device, such methods, and such circuit in which means for starting the dynamoelectric machine is electrically isolated from but spaced closely adjacent to thermal responsive means for protecting a winding circuit of the dynamoelectric machine wherein heat generated by the starting means is transmitted to the protecting means for predetermining the operating period thereof; the provision of such combination starter-protector device, such protecting and operating methods, and such circuit in which the components thereof are simplistic in design and operation, economically manufactured, and easily assembled. Other objects and advantageous features of the invention will be in part apparent and in part pointed out hereinafter.

In general and in one form of the invention, a combination starter-protector device, which is adapted to be connected in circuit relation with a winding circuit of a dynamoelectric machine, includes a housing, and means is movable in the housing in response to a preselected thermal condition for interrupting the winding circuit in the event of the occurrence of a current overload. Means is provided for controlling starting of the dynamoelectric machine and is operable generally to transmit heat to the interrupting means to delay movement thereof to an uninterrupted position effectively completing the winding circuit. Means is disposed in the housing for connecting the starting controlling means in the winding circuit and for predeterminately positioning the starting controlling means generally closely adjacent the interrupting means in heat transferring relation therewith.

In general, a method in one form of the invention is provided for protecting auxiliary winding means and main winding means in a winding circuit of a dynamoelectric machine in the event of the occurrence of a current overload. In this method, means is actuated in response to a preselected thermal condition accompanying the current overload for interrupting the winding circuit, and heat is transferred from means for controlling starting of the dynamoelectric machine to the interrupting means for maintaining the winding circuit effectively interrupted for at least a predetermined period. The starting controlling means is operable generally in response to current flow therethrough to increase its resistance generally as a function of its temperature for impeding the current flow therethrough to the auxiliary winding means generally at a preselected running speed of the dynamoelectric machine.

Further and in general, a method in one form of the invention is provided for operating a dynamoelectric machine having a winding circuit adapted for energization across a power source and including main winding means and auxiliary winding means with the auxiliary winding means associated with means for controlling the energization thereof and with the winding circuit associated with means for protecting it in the event of the occurrence of a current overload. In this method, the dynamoelectric machine is started by energizing the winding circuit across the power source with the energization controlling means being energized in response to current flow therethrough to increase its resistance as a function of its temperature and impede the current flow therethrough to the auxiliary winding means generally at a preselected running speed of the dynamoelectric machine. The protecting means is actuated in response to a preselected thermal condition accompanying the current overload upon the occurrence thereof from a first position effecting the energization of the winding circuit to another position interrupting the energization of the winding circuit and also the energization of the energization controlling means. The energization controlling means may be momentarily reenergized to generate heat acting to supplement the thermal actuation of the interrupting means and effect the reaction thereof to the another position in the event the interrupting means momentarily cycles from its another position to its first position during the occurrence of the current overload.

Also in general, a circuit is provided in one form of the invention and adapted to be energized across a power source. The circuit includes auxiliary winding means and main winding means connected in a winding circuit of a dynamoelectric machine and adapted for energization across the power source to operate the dynamoelectric machine generally at a preselected running speed therefor. Means having a characteristic of increasing its resistance generally as a function of its temperature is operable generally for impeding current flow therethrough to the auxiliary winding means generally at the preselected running speed of the dynamoelectric machine when it is energized. Means is also provided in circuit relation with the winding circuit for protecting it in the event of the occurrence of a current overload of the dynamoelectric machine when it is energized. The protecting means include means operable generally in an at-rest position so as to complete the circuit upon the energization thereof and movable in response to a preselected thermal condition accompanying the current overload upon the occurrence thereof toward another position for interrupting the energization of the winding circuit so as to protect the auxiliary winding means and the main winding means. Housing means encloses both the impeding means and the interrupting means and includes means for connecting the impeding means in circuit relation with the auxiliary winding means and for mounting the impeding means within the housing means closely adjacent and in heat transfer relation with the interrupting means so that the heat generated by the impeding means when it is energized is transferred to the interrupting means in order to assist in the heat responsive movement thereof to the another position in the event the interrupting means momentarily cycles to its at-rest position momentarily completing the winding circuit during the occurrence of the current overload.

BRIEF DESCRIPTION OF THE DRAWINGS

Corresponding reference characters indicate corresponding parts throughout the several views of the drawings.

The exemplifications set out herein illustrate the preferred embodiments of the invention in one form thereof, and such exemplifications are not to be construed as limiting in any manner the scope of the invention.

DETAILED DESCRIPTION OF THE PREFERRED EMBODIMENTS

Figure 8:
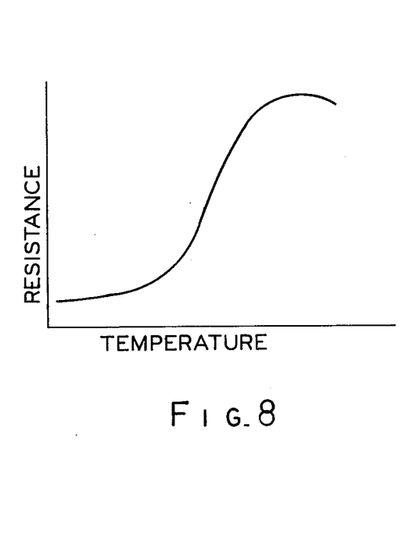
FIG. 8 is a graphical representation illustrating the relationship of temperature and resistance of a thermally responsive resistance member upon passage of current therethrough.

Referring now in general to the drawings, there is illustrated a method in one form of the invention for protecting a start or auxiliary winding or winding means 1 and a run or main winding or winding means 3 in a circuit, as indicated generally at 5, 7, 9 (FIGS. 1-3), for a dynamoelectric machine 11, such as an electric motor of a split phase type, in the event of an overload thereof. In this protecting method, means, such as a switch actuator or bimetal or element 13 of a combination starter-protector device indicated generally at 15, is actuated in response to a certain or preselected thermal condition which may accompany a current overload or other overload condition for interrupting circuits 5, 7, 9 to both start winding 1 and run winding 3. Heat is transmitted generally from means, such as temperature responsive resistance member, thermistor, or a positive temperature coefficient resistor 17 (referred to hereinafter as a PTCR), for controlling starting of motor 11 to the interrupting means or bimetal switch or disc 13 (FIG. 4) for generally maintaining circuits 5, 7, 9 effectively interrupted for at least a predetermined period. Starting controlling means or PTCR 17 is operable generally in response to current flow therethrough to increase its resistance generally as a function of its temperature (FIG. 8) for taking start winding 1 out of circuit relation with run winding 3 generally at a certain or preselected running speed of dynamoelectric machine 11. It may be noted that for the most part, the heat transferred from PTCR 17 to bimetal disc 13 is transferred by radiation, and while the bimetal disc may cycle several times between its circuit completing and interrupting positions during the motor or circuit overload, the heat transferred from the PTCR to the bimetal disc does prevent the bimetal disc from remaining in the circuit completing position while the overload continues, i.e., the circuit is effectively open or interrupted. In other words, the heat transferred by PTCR 17 to bimetal disc 13 lengthens or increases its "off time", i.e., when the bimetal disc is in its circuit breaking position, even though the bimetal disc may cycle between its circuit making and breaking positions, as discussed in greater detail hereinafter.

Figure 1:
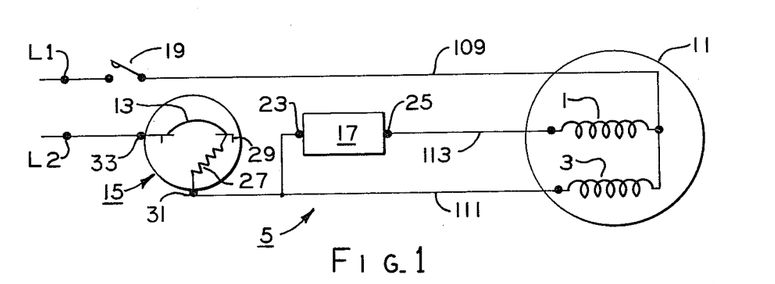
FIGS. 1–3 are schematic diagrams of at least some circuits in one form of the invention for a dynamoelectric machine showing a combination starter-protector device also in one form of the invention and teaching principles of a method for protecting the dynamoelectric machine and a method of operating the dynamoelectric machine in one form of the invention, respectively.

More particularly and with specific reference to FIG. 1, connection of motor 11 across a pair of power terminals L1, L2 by suitable means, such as an on-off type switch or the like 19, is effective to energize both start winding 1 and run winding 3 thereby to start or energize the motor by drawing current through its winding circuit 5 which comprises start winding 1 and run winding 3 connected in parallel circuit relation. As illustrated generally in the graphical representation of FIG. 8, the resistance of PTCR 17 to current flow therethrough increases as a function of its temperature. Assuming that the temperature of PTCR 17 is rather low at motor start-up, the PTCR will initially pass current at a value sufficiently great enough to permit the energization of start winding 1 thereby to effect a higher starting torque of the motor during the starting or start-up period thereof. Referring again to the graphical representation of FIG. 8, as the temperature of PTCR 17 increases in response to current flow therethrough, the resistance to such current flow also increases to a value which, in general, effects the electrical disassociation of starting winding 1 from circuit relation with run winding 3. In other words, when the resistance of PTCR 17 attains the aforementioned increased or high value, the PTCR acts to impede or throttle current flow therethrough to start winding 1 which renders it generally ineffective in the winding circuit of motor 11. The point in time during motor start-up that start winding 1 may be so electrically disassociated or taken out of circuit relation with run winding 3 by PTCR 17 may be predetermined so as to generally coincide with the running speed of motor 11. That is to say, start winding 1 may be disabled or taken out of circuit 5 generally about the time motor 11 attains its running speed. Of course, PTCR 17 will not act to obviate current flow to start winding 1 during running of motor 11 but it will throttle or restrict such current flow to such a minimal or small value that the start winding is generally ineffectual in circuit 5, as is well known in the art. It may be noted that heat generated by PTCR 17 during start-up and running of motor 11 may be radiated or directed toward bimetal disc 13 at least through an opening 21, FIG. 4, in one of a pair of terminals 23, 25 of combination starter-protector device 15 toward bimetal disc 13 which is disposed closely adjacent the PTCR in heat transfer relation therewith, but electrically isolated therefrom, within the combination starter-protector device, as discussed in greater detail hereinafter.

A plurality of terminals 29, 31, 33 may be provided in combination starter-protector device 15 for connection in a three-phase system within the scope of the invention; however, for purposes of simplicity, the combination starter-protector device is discussed herein as connected in a single phase system. During the start-up and running stages modes of motor 11, bimetal disc 13 may be disposed in its circuit making or completing position in circuit 5 in making engagement between terminals 29, 33. In its circuit making position, bimetal disc 13 is heated in response to current flowing therethrough. When motor 11 is running under normal operating conditions, heat generated by current flowing through bimetal disc 13 is predeterminately less than that necessary for effecting movement of the bimetal disc with characteristic snap-action from its circuit completing position to a circuit interrupting position disengaged from terminals 29, 33. Of course, materials or bimetal disc 13 and the size and shape thereof may be chosen or predetermined so that it may be cycled between its circuit making and breaking position in response to a selected amount of heat supplied thereto, as is well known in the art. Therefor, under normal operating conditions of motor 11, bimetal disc 13 remains in its circuit making position urging its pair of electrical contacts 35, 37 into electrical contacting engagement with terminals 29, 33. While movement of bimetal disc 13 between its circuit making and circuit breaking positions is discussed herein as a snap-action movement, it is contemplated that bimetal disc 13 may be constructed so as to be a slow acting type switch, i.e. movable between its circuit completing and interrupting positions without snap-action within the scope of the invention.

From the foregoing, it is apparent that bimetal disc 13 may be made thermally actuable or operable in the combination starter-protector device 15 only in response to its own heat generated by current flowing therethrough which may be supplemented by heat supplied or applied from PTCR 17 to the bimetal, as discussed in greater detail hereinafter. However, in some motor applications, means, such as a resistance heater or heating coil 27a, for also heating bimetal disc 13 may be connected in circuit 5 in series relation between terminals 29, 31 in combination starter-protector device 15. Heating coil 27 is disposed generally closely adjacent bimetal disc 13 in heat transfer relation therewith, and heat generated by the heating coil is, for the most part transferred by radiation to the bimetal disc. When motor 11 is running under normal operating conditions, heat generated by heating coil 27, as well as that generated by bimetal disc 13, in response to current flowing therethrough is predeterminately less than that amount of heat necessary for effecting actuation of the bimetal disc from its circuit completing position. For purposes of clarity, combination starter-protector device 15 is discussed hereinafter as including heating coil 27, but it will be recalled that the combination starter-protector device may also function without the heating coil in some motor applications, as previously discussed within the scope of the inventions.

As is well known in the art, overload conditions may deleteriously affect components of a motor, such as shorting or burning-out motor windings for instance. These overload conditions may be effected by a plurality of different causes or by combinations of such causes. For instance, some of the well known causes of motor overload conditions are: a running overload; a high temperature overload; an overload occasioned by a stalled or locked rotor; and a high current overload. Irrespective of the particular cause or combination of causes effecting a motor overload condition, a deleteriously high current is drawn by the motor, and such high current is usually accompanied by or results in a high temperature. Therefore, for the sake of simplifying the discussion of motor overload conditions hereinafter, it is to be understood that any cause for effecting such motor overload will be discussed only within the context of a high current draw or current overload condition accompanied by a high temperature condition with respect to the motor windings.

In the event of the occurrence of an overload or high current condition in motor 11, a relatively large amount of current may be drawn in circuit 5 which could deleteriously affect start winding 1 and run winding 3, as mentioned hereinabove. However, bimetal disc 13 and heating coil 27 are responsive to such high current and temperature increase to correspondingly increase the heat generated thereby, respectively, to effect characteristic snap-action actuation of the bimetal disc breaking its contacts 35, 37 from terminals 29, 33. In this manner, circuit 5 is opened effecting de-energization of motor 11 and isolating or electrically disassociating start winding 1 and run winding 3 from the current overload which may then exist in motor 11 across power terminals L1, L2.

Of course, the opening of circuit 5, as discussed above, also effects de-energization and the resultant cooling of PTCR 17 and heating coil 27. Even with the supplemental heat supplied or radiated from PTCR 17 to bimetal disc 13, the bimetal disc may cool sufficiently in its circuit interrupting position so as to cycle several or a plurality of times between the circuit interrupting position and the circuit completing position thereof. Such cycling of bimetal disc 13 may occur throughout or over a predetermined relatively short period of time, and such cycling is only effective to replace motor 11 in circuit relation across power terminals L1, L2 for relatively very short periods of time. When bimetal disc 13 so cycled to its circuit completing position, PTCR 17 and heating coil 27 are, of course, re-energized to again supply heat to the bimetal disc during the aforementioned relatively short period of time thereby to again effect cyclical movement of thermal actuation of the bimetal disc to its circuit interrupting position. Even though bimetal 13 may cycle, as discussed above, for a brief period of time subsequent to the occurrence of the overload condition in motor 11, it has been found that the supplemental heat transferred in the main by radiation from PTCR 17 to bimetal disc 13 is effective to increase the "off-time" thereof, i.e. when the bimetal disc is in its circuit interrupting position, throughout the aforementioned predetermined relative short period of time. In view of the foregoing, it may also be noted that the predeterminately increased "of-time" of combination starter-protector device 15, i.e. of bimetal disc 13 therein, occasioned by the supplemental heat supplied or transferred thereto from PTCR 17 allows the PTCR itself to cool. As PTCR 17 cools, the resistance thereof is correspondingly reduced generally as a function of the decreasing temperature. When the resistance and temperature of PTCR 17 are so reduced to a sufficiently low value, the PTCR will again permit the passage therethrough of current at sufficiently high enough values to effect restarting of motor 11. Therefore, when bimetal disc 13 also cools enough to cycle back to its uninterrupted circuit completing condition, current is drawn through PTCR 17 at values great enough to again effect re-energization of start winding 1 to aid re-energized run winding 3 in bringing motor 11 up to its predetermined speed. When motor 11 attains its running speed, the self-heating effect of PTCR 17 once again raises its temperature and its resistance value as a function thereof to reduce current flow therethrough to a value which is ineffective with respect to start winding 1; therefore, the start winding may again be taken out of circuit 5 or, in effect, electrically disassociated from energized run winding 3, as previously described, thereby to effect restarting of motor 11. Thus, restarting of motor 11 assumes that the cause of the overload condition has been alleviated or corrected, and if not so alleviated, combination starter-protector device 15 may again operate or function to open circuit 5 taking motor 11 off the line across power terminals L1, L2 as previously described.

Figure 3:
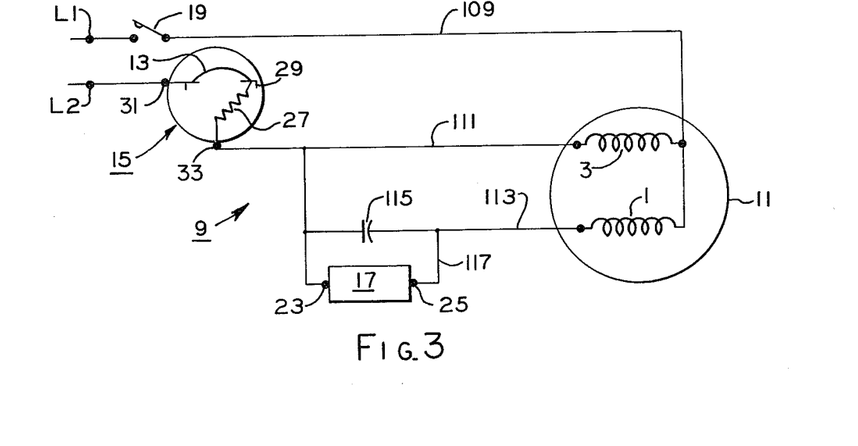
Figure 4:
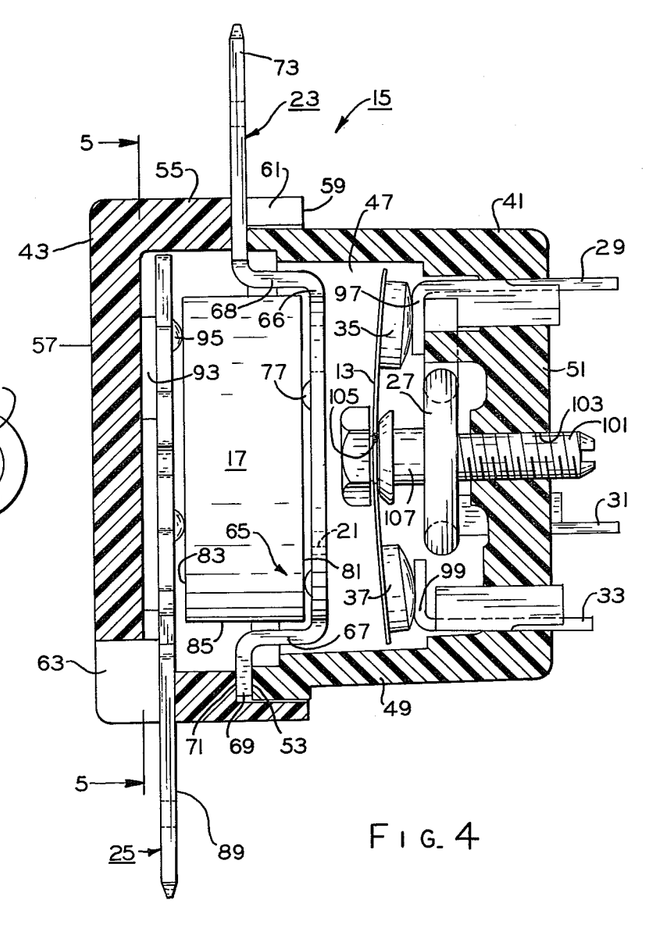
FIG. 4 is a sectional view illustrating the combination starter-protector device of FIGS. 1–3 in cross-section.
Figure 5:
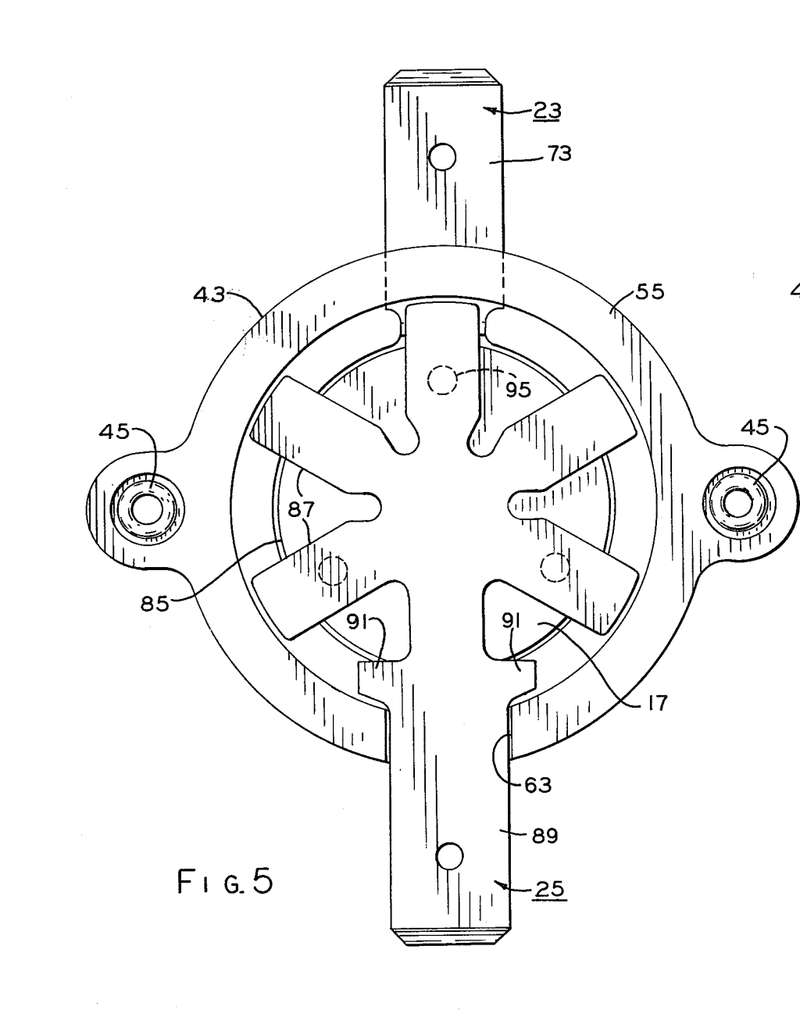
FIG. 5 is a sectional view taken generally along line 5—5 in FIG. 4.

Referring now again to the drawings in general, combination starter-protector device 15 in one form of the invention is adapted to be connected in circuit 5, 7, 9 with windings, such as start and run windings 1, 3 of motor 11 (FIGS. 1–3), and the device includes a housing 41 with means, such as bimetal disc 13, movable therein in response to a certain thermal condition for interrupting the circuit in the event of winding overload (FIGS. 4 and 5). Means, such as PTCR 17, is provided for controlling starting of motor 11, and the PTCR is operable generally to transmit heat to the interrupting means to delay movement thereof to an uninterrupted position effectively completing the circuit. Means, such as terminals 23, 25, is disposed in housing 41 for connecting starting controlling means or PTCR 17 in the circuit and for predeterminately positioning the PTCR generally closely adjacent the interrupting means or bimetal disc 13 in heat transferring relation therewith.

More particularly and with specific reference to FIGS. 4 and 5, housing or casing 41 includes a closure member or end cap 43 interconnected therewith against displacement by any suitable means, such as a pair or rivets 45 for instance, and a housing chamber 47 is formed within the housing and its end cap. Housing 41 is provided with a generally annular side wall 49, and a base wall 51 is integral with the rightward end of the side wall while the leftward end 53 thereof is a generally annular free or abutment end. End cap 43 is also provided with a generally annular side wall 55, and another base wall 57 is integral with the leftward end of the side wall while the rightward end 59 thereof is a generally annular free end which is disposed in overlapping or generally telescopic sliding engagement with abutment end 53 of housing side wall 49. Side walls 49, 55 and base walls 51, 57 comprise a plurality of walls on casing 41 and end cap 43. A pair of generally oppositely spaced, terminal receiving slots or openings, 61, 63 are respectively provided through free end 59 of end cap side wall 55 and also the free end and base wall 57 generally at the juncture thereof.

Terminal 23 is provided with an off-set portion 65 generally constituted by base wall 66, through which opening 21 extends, and a pair of integral end walls 67, 68 disposed generally normal to the base wall. One of the end walls 67 is integral with a radially extending lip or abutment 69 which is disposed in abutting or locating engagement between abutment end 53 of housing side wall 49 and a seat or abutment 71 provided on end cap side wall 55. An electrical connection or exterior portion 73 of terminal 23 is integral with the other of the end walls 68. Terminal exterior portion 73 is seated on abutment end 53 of end cap side wall 55 and extends through slot 61 exteriorly of housing 41 for circuit connection purposes. It may be noted that the abutment of terminal connection portion 73 with end cap side wall 55 about slot 61 therein predeterminately locates terminal 23 with respect to housing 41 and end cap 43 thereof. Further, it may also be noted that end walls 67, 68 and base wall 66 of terminal 23 define off-set 65 in which PTCR 17 is received in both supporting engagement and electrical contacting engagement with terminal 23, as discussed hereinafter. Base wall 66 is provided with a plurality of seating nodes or dimples 77 for positioning or supporting engagement and electrical contacting engagement with PTCR 17. Although terminal 23 has been described as having a generally off-set portion 65, it is contemplated that other physical shapes, such as an annular recess for instance, may be provided within the scope of the invention. Although PTCR 17 is shown and described in one form of the invention herein, it is contemplated that other thermistors well known to the art having the inherent characteristic of being self-heating wherein its resistance to current flow is generally a function of its temperature may be utilized within the scope of the invention. PTCR 17 is generally cylindric in shape having a pair of opposite ends or electrical contact portions 81, 83 interconnected by a peripheral portion 85. Although PTCR 17 is shown and described as generally cylindric in shape, it is contemplated that a PTCR shaped other than generally cylindric may be utilized within the scope of the invention. Rightward end 81 and at least a part of peripheral portion 85 are disposed within off-set of terminal 23 with dimples 77 of terminal base wall 66 and end walls 67, 68 in both supporting engagement and electrical contacting engagement with at least a portion of the rightward end and peripheral portion of PTCR 17, respectively.

Terminal 25 is provided with a plurality of generally flat, radially extending fingers 87, and the free ends of at least some of the fingers may be provided for abutting or locating engagement with end cap side wall 55 interiorly of housing chamber 47. An electrical connection or exterior portion 89 of terminal 25 is integral with one of fingers 87 and extends through slot 63 exteriorly of end cap 43 for circuit connection purposes. It may be noted that the abutment of terminal connection portion 89 with end cap side wall 55 and base wall 57 about slot 63 therein at least in part predeterminately locates terminal 25 with respect to end cap 43. Other means, such as a pair of oppositely extending fins or locating abutments 91, for locating engagement with end cap side wall 55 within housing chamber 47 may also be integrally provided on connection portion 89 of terminal 25. A plurality of generally axially extending abutments or hubs 93 are integrally formed on end cap base wall 57 and engaged with the leftward side of terminal 25 for urging a plurality of dimples on some of the fingers 87 into both supporting engagement and electrical contacting engagement with leftward end 83 of PTCR 17. In this manner, the urging of terminal 25 into engagement with PTCR leftward end 83 not only supports PTCR 17 within off-set 65 of terminal 23 against displacement therefrom but also ensures good electrical contacting engagement between terminals 23, 25 and PTCR 17.

Figure 2:
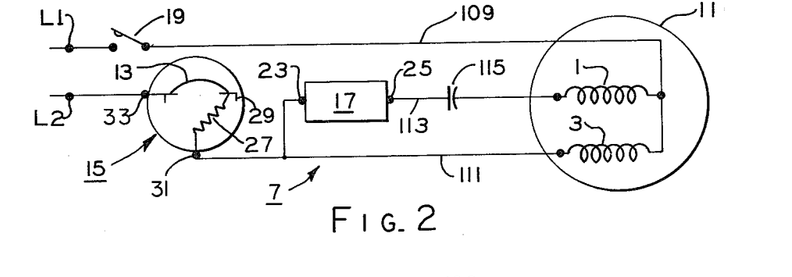

Terminals 29, 31, 33 are molded or otherwise disposed in base wall 51 of housing 41 extending therethrough, and as previously mentioned, terminals 31, 33 are exteriorly connected in circuits 5, 7, 9 of FIGS. 1–3. The interior ends of terminals 29, 33 define stationary electrical contacts 97, 99 for making and breaking engagement with movable contacts 35, 37 on bimetal disc 13, as further discussed hereinafter. While terminal 29 is shown with an exterior portion for connection in a three phase system, it is contemplated that only the contact 97 may be utilized within the scope of the invention. As previously mentioned, heating coil 27 may be connected in series circuit relation between stationary contact 97 and terminal 31 so that it may be isolated from power terminals L1, L2 along with start winding 1 and run winding 3 upon the interruption of circuit 5, as previously mentioned.

An adjustable screw 101 is threadedly received in a centrally located threaded opening or aperture 103 provided in base wall 51 of housing 41, and the screw extends generally coaxially through heating coil 27. Bimetal disc 13 is generally frustoconically shaped having a central opening 105 therein which is received on screw 101 adjacent the head thereof, and the bimetal disc is clamped or fixedly positioned between the head of the screw and a retainer 107 fixedly disposed on the screw. Movable contacts 35, 37 are soldered, welded or otherwise connected by suitable means well known in the art of the rightward side of bimetal disc 13 for making and breaking engagement with stationary contacts 97, 99, respectively. Of course, the frustoconical shape of bimetal disc 13 is effective to impart snap-action movement to movable contacts 35 37 between their making and breaking positions with respect to stationary contacts 97, 99, and screw 101 may be manually adjusted to adjustably predetermine the force necessary to effect snap-action of bimetal disc 13 between the making and breaking positions of movable contacts 35, 37. To complete the description of combination starter-protector 15, it may be noted that bimetal 13 is disposed in housing chamber 47 closely adjacent rightward end 81 of PTCR 17 which is communicated through opening 21 in terminal 23 in heat transfer relation with the leftward side of bimetal disc 13.

Figure 6:
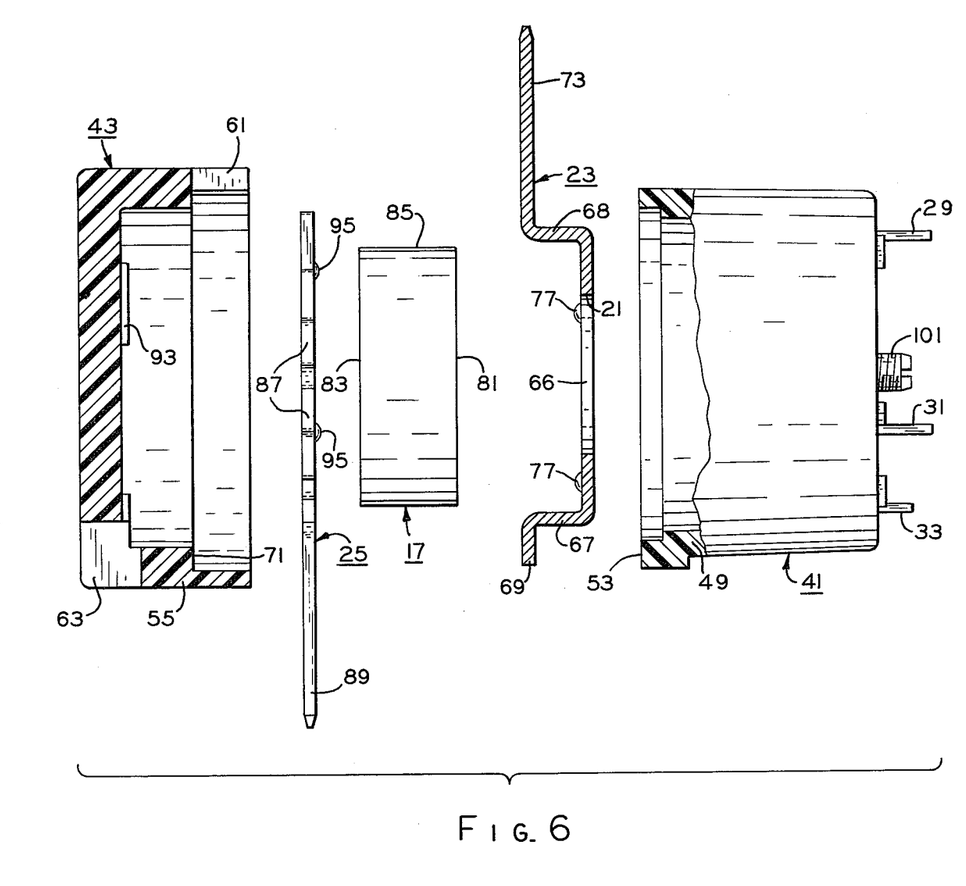
FIG. 6 is an exploded view of at least some of the components of the combination starter-protector protector of FIG. 4.
Figure 7:
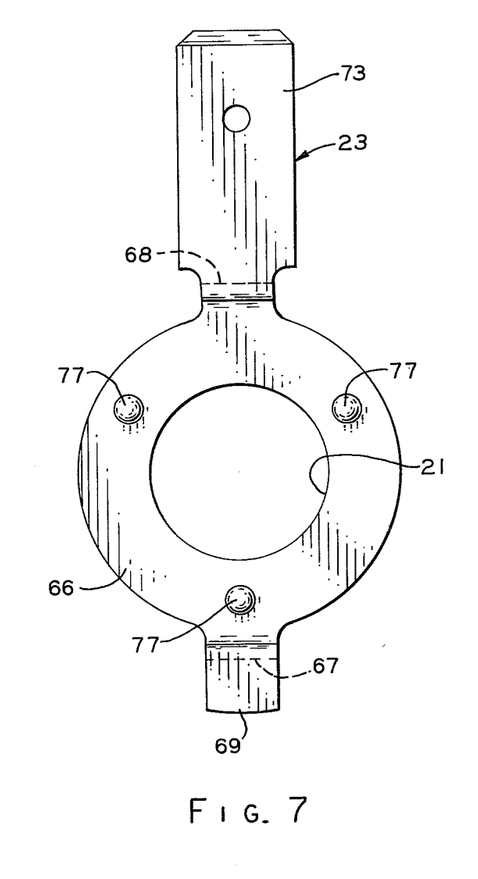
FIG. 7 is a plan view of one of the terminals of the combination starter-protector device.

As may be seen in FIGS. 4–6, there is illustrated a method of assembling a temperature responsive resistance member, such as PTCR 17, within a pair of separable housings, such as housing 41 and end cap 43. In this method, PTCR 17 is mounted in both supporting engagement and electrical contacting engagement between terminal pair 23, 25. Housing 41 and end cap 43 then are joined against displacement so as to encase therein PTCR 17 in both the supporting engagement and the electrical contacting engagement with terminals 23, 25 and with portions 73, 89 thereof extending exteriorly of housing 41 and end cap 43.

More particularly, PTCR 13 may be inserted into off-set 65 of terminal 23 so that the rightward end 81 is in supporting engagement and in electrical contacting engagement with dimples 77 of terminal base wall 66, respectively. Terminal 25 may also be assembled to end cap 43 with terminal connection portion 89 extending through slot 63 in locating engagement therewith and with the free ends of fingers 87 in locating engagement with the interior of end cap side wall 55. Of course, the disposition of PTCR 17 in terminal 23 and the disposition of terminal 25 in end cap 43 may be alternately or simultaneously performed. Terminal 23 with PTCR 17 therein may now be located with respect to housing 41 and end cap 43 by disposing connection portion 73 of terminal 23 and slot 61 in the end cap in locating engagement with each other. Of course, with terminal 23 and end cap 43 so located, dimples 95 of terminal 25 are disposed in both supporting engagement and electrical contact engagement with end 83 of PTCR 15. Housing 41 may be disposed with the leftward end 53 of its side wall 49 in supporting or abutting relation with lip 69 of terminal 23 as it is located with respect to end cap 43, as discussed above, or may be subsequently disposed on the lip. At this time, rivets 45 may be disposed in aligned apertures respectively provided therefor in housing 41 and end cap 43 and riveted over so as to join or maintain the housing and the end cap against displacement or separation from each other.

Referring now in general to FIG. 6 and recapitulating, at least in part with respect to the foregoing, a device, such as combination starter-protector 15 or other electrical component for instance, may be assembled in accordance with the teachings of the assembling method, as discussed hereinabove, for connection in an electrical circuit, such as those indicated at 5, 7, 9 for instance (FIGS. 1-3). Device 15 includes a pair of housings, such as housing 41 and end cap 43, joined together against displacements, such as by rivets 45 or other suitable connecting means, and a temperature responsive resistance member, such as PTCR 17 (FIGS. 4 and 5). A pair of terminals 23, 25 respectively include means, such as terminal off-set 65 and terminal fingers 87, respectively, encased within the housings for mounting PTCR 17 therein so that the terminals are disposed in both supporting engagement and electrical contacting engagement with the PTCR. Means, such as connection portions 73, 89 on terminals 23, 25, are provided for connection in the electrical circuit.

Referring now specifically to FIG. 1, circuit 5 in one form of the invention for motor 11 is shown having at least one start winding 1 and at least one run winding 3. Means, such as a lead 109, is electrically interconnected with one of the respective opposite end portions of start winding 1 and run winding 3 for placing them in connection with one side, such as power terminal L1, a source of power. Other means, such as a lead 111, is connected with the other opposite end of run winding 3 for placing it in connection with the other side, such as power terminal L2, of the power source. Means, such as PTCR 17, has a characteristic of increasing its resistance generally as a function of its temperature in response to the flow of power therethrough is disposed in a lead 113 in series circuit relation between the other opposite end of start winding 1 and lead 111. PTCR 17 is thereby operable generally for electrically disassociating start winding 1 from run winding 3 at a selected speed of motor 11 when it is energized by closure of on-off switch 19 interposed in lead 109. Means, such as overload protector switch or switch means 13, may be disposed in one of leads 109, 111 for protecting start winding 1 and run winding 3 in the event of a current overload of motor 11 when it is energized. Combination starter-protector device 15 may include means, such as heating coil 27, responsive to current flowing at least through run winding 3 for generating heat at least upon the occurrence of the current overload and also means, such as bimetal disc 13, adapted to be movable in response to heat transferred thereto at least from the heating coil or heat generating means from an uninterrupted closed or "on" position in the one of leads 109, 111 to effect the flow of current through circuit 5 to an uninterrupted open or "off" position interrupting the flow of current through the circuit. Movable means or bimetal disc 13, at least in the open position thereof, is electrically isolated from the disassociating means or PTCR 17 and yet spaced closely adjacent to it for receiving heat which is for the most part radiated therefrom so that the bimetal disc may at least in effect be in its open position for at least a predetermined period great enough to permit PTCR 17 to cool to a temperature low enough so that it passes current for motor starting.

In the operation with the component parts of combination starter-protector 15 and circuit 5 in their respective positions as shown in FIGS. 1 and 4, closure of on-off switch 19 places motor 11 across power terminals L1, L2 so as to be energized or started. Current flows through lead 109 from power terminal L1 to start winding 1 and run winding 3. A portion of the current takes a path through start winding 1, PTCR 17 and leads 111, 113 to terminal 33 of combination starter-protector device 15, and the other portion of the current takes a path through run winding 3 and lead 111 to terminal 33. From terminal 33, the current flows through stationary contact 99 and movable contact 37 in their making positions, bimetal disc 13, movable contact 35 and stationary contact 97 in their making positions, and therefrom through heating coil 27 and terminal 31 to power terminal L2.

When switch 19 is closed to energize circuit 5, PTCR 17 is at a relatively cool temperature and passes enough current therethrough for effectively energizing start winding 1; however, due to self-heating, the PTCR characteristically increase its resistance generally impede or as a function of its temperature rise thereby to generally throttle current flow to start winding 1. In this manner, start winding 1 is taken out of circuit relation with run winding 3 generally as motor 11 attains its running speed thereafter to be energized only by run winding 3.

In the event of a current overload in circuit 5 which may be occasioned by a stalled or locked rotor condition or other conditions, well known to the art, the high current draw in circuit 5 is effective to increase heat generated in bimetal disc 13 and by heating coil 27. This increased quantity of heat causes bimetal disc 13 to move with characteristic snap-action to its circuit opening or breaking position breaking movable contacts 35, 37 thereon from stationary contacts 97,99. In this manner, circuit 5 is opened, and PTCR 17 and both start winding 1 and run winding 3 are electrically disassociated or isolated from the power source across power terminals L1, L2 to interrupt current flow through the circuit. With the current flow so interrupted, bimetal disc 13 and heating coil 27 cool so that since current flow to PTCR 17 is also obviated, it also cools surrendering or radiating at least part of its heat through opening 21 in terminal 23 to bimetal disc 13. Such cooling of bimetal disc 13 may cause it to revert from its open position to its closed position to temporarily or momentarily again complete circuit 5. Such temporary completion of circuit 5 again subjects bimetal disc 13 and heating coil 27 to the high current draw which causes reheating of the bimetal disc 13 to again effect movement thereof to its open position interrupting circuit 5. This cycling or fluctuation of bimetal disc 13 between its circuit opening and closing position may occur at least several times. However, it has been found that the heat radiated from PTCR 17 to bimetal disc 13 supplements the reduced amount of heat generated therein and/or supplied thereto from heating coil 13 so as to maintain the bimetal disc in an uninterrupted open position to effectively interrupt circuit 5 for a period of time necessary to allow the PTCR to properly cool to a reduced temperature. In other words, the supplemental amount of heat supplied to bimetal disc 13 from PTCR 17 predeterminately delays or restrains return movement of the bimetal disc to its uninterrupted closed position to effectively complete circuit 5 for a period at least great enough to effect reduction of the temperature and resistance of the PTCR to a value so as to pass a sufficient amount of current to again effectively energize start winding 1 for restarting motor 11. When the heat generated by PTCR 17 or by both the PTCR and heating coil 27 is reduced to a value insufficient to maintain bimetal disc 13 in its open position, the bimetal disc then returns with characteristic snap-action to its uninterrupted closed position remaking movable contacts 35, 37 with stationary contacts 97, 99 thereby to again uninterruptedly complete circuit 5 across power terminals L1, L2. Assuming that the condition effecting the current overload of circuit 5 has been corrected or has corrected itself, then the return of bimetal disc 13 to its circuit making position will again effect current flow through circuit 5 in the same manner previously as discussed above. Since the return of bimetal disc 13 to its uninterrupted circuit making position is predeterminately delayed as previously described, the temperature of PTCR 17 is now reduced to a relatively cool range, and the value of its resistance is correspondingly reduced so that the PTCR may pass current for effectively energizing start winding 1 along with energization of run winding 3 to restart motor 11. Of course, if the current overload persists in circuit, then combination starter-protector 15 will re-cycle, as described above.

Referring now to circuit 7 of FIG. 2, it contains generally the same components and functions generally in the same manner as the previously described circuit 5 except that a capacitor 115 is serially connected in lead 113 between terminal 25 of PTCR 17 and start winding 1. With capacitor 115 in motor circuit 7, motor 11 may be operated as a permanent split capacitor type motor. In the operation of circuit 7, PTCR 17 is operable generally to block capacitor 113 when the temperature and resistance of the PTCR rise to values throttling current flow therethrough to take start winding 1 out of circuit 5, as discussed above.

Circuit 9 of FIG. 3 is provided with the same components and functions in the same manner as the previously discussed circuit 7 with the exception that PTCR 17 is connected in a lead 117 connected with lead 113 in shunt circuit relation with capacitor 115. In circuit 9, PTCR 17 effectively shorts out capacitor 115 during the starting state of motor 11 allowing it to start as a resistance split phase motor with a high starting torque. Self-heating of PTCR 17 and the high resistance thereof, as previously discussed, allows motor 11 to run as a highly efficient permanent split phase capacitor motor.

From the foregoing, it is now apparent that there is provided a novel combination starter-protector device 15, a novel method of protecting a dynamoelectric machine, a novel method of operating a dynamoelectric machine, and a novel circuit 5, 7, 9 which meet the objects and advantages set forth hereinabove, as well as others. Further, it is contemplated that changes as to the precise connections and arrangements, shapes and details of the of the circuits and constructions, as well as the precise steps of the methods, respectively illustrated herein in one form of the invention, may be made by those having ordinary skill in the art without departing from the spirit of the invention or scope thereof as set out in the claims which follow.

What I claim as new and desire to secure by Letters Patent of the United States is:

1. A method of protecting auxiliary winding means and main winding means in a winding circuit of a dynamoelectric machine upon the energization thereof across a power source with a combination starter-protector device being adapted for association in circuit relation with the winding circuit, the device including bimetal switch means operable generally in the event of the occurrence of a current overload for interrupting the supply of power to the winding circuit, and means for controlling starting of the dynamoelectric machine, the starting controlling means being energized to vary its resistance generally as a function of its temperature in response to current flow therethrough to the auxiliary winding means and to impede the current flow to the auxiliary winding means generally as the dynamoelectric machine attains a preselected running speed, the method comprising the steps of:
   (a) actuating the bimetal switch means of the device generally in response to a preselected thermal condition accompanying the current overload in the event of the occurrence thereof and causing the interruption of the supply of power to the winding circuit for a period of time; and
   (b) supplementing the thermal responsive actuation of the bimetal switch means so as to generally extend the time period and maintain the winding circuit effectively interrupted by transmitting to the bimetal switch means heat generated by the starting controlling means upon its energization and in the event the bimetal switch means momentarily remakes the winding circuit to supply power thereto during the occurrence of the current overload.

2. A method of protecting auxiliary winding means and main winding means in a winding circuit of a dynamoelectric machine upon the energization thereof across a power source with a combination starter-protector device being adapted for association in circuit relation with the winding circuit, the device including means for interrupting the supply of power to the winding circuit for a period of time in the event of the occurrence of a current overload, and means for controlling starting of the dynamoelectric machine, the starting controlling means being energized to vary its resistance generally as a function of its temperature in response to current flow therethrough to the auxiliary winding means and to impede the current flow to the auxiliary winding means generally as the dynamoelectric machine attains a preselected running speed, the method comprising the steps of:
   (a) positioning the starting controlling means and the interrupting means within a housing of the device and mounting with the housing electrical conductive means for connecting the starting controlling means in circuit relation with the auxiliary winding means and for supporting the starting controlling means closely adjacent the interrupting means in heat transfer relation therewith;

(b) actuating the interrupting means in response to a preselected thermal condition accompanying the current overload in the event of the occurrence thereof to interrupt the supply of power to the winding circuit for the time period; and (c) supplementing the thermal responsive actuation of the interrupting means so as to generally extend the time period and generally maintain the winding circuit effectively interrupted by transmitting to the interrupting means heat generated by the controlling means upon its energization in the event the interrupting means momentarily remakes the winding circuit to supply power thereto during the occurrence of the current overload.

3. The method as set forth in claim 2 wherein the interrupting means includes a bimetal switch actuator movable between an open position to effect the interruption of the supply of power to the winding circuit and a closed position to effect the supply of power to the winding circuit, the starting controlling means being supported in the heat transfer relation with the bimetal switch actuator and adjacent thereto.

4. A combination starter-protector device adapted to be connected in circuit relation with a winding circuit of a dynamoelectric machine comprising:
a housing;
a plurality of wall means on said housing defining a chamber therein;
means in said chamber disposed in mounting relation adjacent one of said wall means of said wall means plurality and movable in response to a preselected thermal condition accompanying a current overload in the event of the occurrence thereof from a closed position to an open position for generally electrically isolating the winding circuit from the current overload;
means energized generally for controlling the starting energization of the dynamoelectric machine and mounted within said chamber adjacent said isolating means in heat transfer relation therewith, said controlling means transferring its heat generated upon its energization to said isolating means so as to delay the uninterrupted return of said isolating means from its open position to its closed position; and
a pair of terminal means engaged with said starting controlling means for positioning it in said chamber adjacent said isolating means in the heat transfer relation therewith and disposed in mounting relation with at least another of said wall means of said wall means plurality.

5. A combination starter-protector device as set forth in claim 4 wherein said isolating means comprises a current overload protecting switch means responsive to the preselected thermal condition for movement from the closed position to the open position.

6. A combination starter-protector device as set forth in claim 4 wherein said isolating means includes a bimetal element.

7. A combination starter-protector device as set forth in claim 4 wherein said starting controlling means comprises a PTCR.

8. A combination starter-protector device as set forth in claim 4 wherein said terminal means respectively include a portion disposed in said chamber in electrical contacting engagement with said starting controlling means and in the mounting relation with the at least another wall means.

9. A combination starter-protector device as set forth in claim 4 wherein said at least another wall means includes a pair of apertures extending therethrough so as to communicate with said chamber, and said terminal means being disposed at least in part in said aperture means, respectively.

10. A method of protecting auxiliary winding means and main winding means in a winding circuit of a dynamoelectric machine upon the energization thereof with an overload protector device adapted for connection in circuit relation with the winding circuit and with means for controlling starting of the dynamoelectric machine associated in heat transfer relation with the overload protector device, the starting controlling means being energized generally in response to current flow therethrough to vary its resistance generally as a function of its temperature so as to impede the current flow to the auxiliary winding means generally at a preselected running speed of the dynamoelectric machine, the method comprising the steps of:

(a) actuating a means of the overload protector device disposed in the heat transfer relation with the starting controlling means and operable generally in response to a preselected thermal condition accompanying a current overload in the event of the occurrence thereof for interrupting the energization of the winding circuit for a period of time at least during the occurrence of the current overload condition; and (b) supplementing the thermal responsive actuation of the interrupting means so as to generally extend the time period and generally maintain the energization of the winding circuit effectively interrupted during the occurrence of the current overload by transmitting to the interrupting means the heat generated by the starting controlling means at least in the event the interrupting means momentarily reenergizes the winding circuit during the occurrence of the current overload.

11. The method as set forth in claim 10 wherein the actuating step includes supplying current to another means for generating heat and transferring such heat to the interrupting means at least during the current overload so as to effect the thermal responsive operation of the interrupting means.

12. The method as set forth in claim 10 comprising the preliminary step of associating the starting controlling means and the interrupting means predeterminately in close spaced relation so as to facilitate the transfer of the heat generated by the starting controlling means to the interrupting means.

13. The method as set forth in claim 10 comprising the preliminary step of disposing the starting controlling means and the interrupting means closely adjacent each other to effect the transfer of the heat directly onto the interrupting means and also transmitting heat from means for generating it at least in response to the current overload to the interrupting means so as to effect the actuating step.

14. The method as set forth in claim 1, wherein the starting controlling means is a PTCR.

15. A combination starter-protector device for a dynamoelectric machine adapted to be energized across a power source comprising:

a housing having a plurality of wall means defining a chamber within said housing;

switch means mounted in association with one of said wall means of said wall means plurality within said chamber and actuated generally in response to a preselected thermal condition accompanying a current overload in the event of the occurrence thereof toward a position for interrupting the energization of the dynamoelectric machine and also in response to cooling toward another position for effecting the reenergization of the dynamoelectric machine;

means for controlling starting of the dynamoelectric machine upon the energization thereof, said starting controlling means being operable generally upon energization to generate and transfer heat to said switch means supplementing its thermal actuation so as to delay its cooling actuation toward its another position; and means mounted within said chamber in association with at least another of said wall means of said wall means plurality for connecting said starting controlling means in circuit relation with the dynamoelectric machine and for predeterminately supporting said starting controlling means within said chamber generally closely adjacent said switch means in the heat transferring relation therewith.

16. A combination starter-protector device as set forth in claim 15 wherein said connecting and supporting means includes means for locating engagement with said at least another wall means within said chamber to maintain said starting controlling means predeterminately spaced from said switch means adjacent thereto.

17. A combination starter-protector device as set forth in claim 15 wherein said connecting and supporting means includes means for locating engagement with said housing to maintain at least a part of said connecting and supporting means generally in a predetermined mounted position within said housing.

18. A combination starter-protector device as set forth in claim 15 wherein said connecting and supporting means includes a recess in which at least a portion of said starting controlling means is disposed.

19. A combination starter-protector device as set forth in claim 15 wherein said connecting and supporting means includes an opening for passing heat from said starting controlling means toward said switch means.

20. A combination starter-protector device as set forth in claim 15 wherein said connecting and supporting means includes means within said chamber for electrical and positioning engagement with said starting controlling means.

21. A combination starter-protector device as set forth in claim 15 wherein said switch means includes at least one terminal extending from said chamber through said one wall means and having an electrical connection portion exteriorly of said housing.

22. A combination starter-protector device as set forth in claim 15 wherein said starting controlling means comprises a PTCR.

23. A combination starter-protector device as set forth in claim 15 wherein said connecting means includes an electrical connection section mounted in said another wall means and extending at least in part therethrough for the connection in the circuit relation with the dynamoelectric machine.

24. A combination starter-protector device adapted to be connected in circuit relation with auxiliary winding means and main winding means of a dynamoelectric machine adapted for energization across a power source comprising a pair of housings connected together against displacement, first and second terminals in one of said housings for connecting the run main winding means to the power source, first and second stationary electrical contacts in said one housing, said first terminal including said first stationary contact, a heating coil in said one housing in circuit relation with said second stationary contact and said second terminal and adapted to be energized in response to current flowing in the main winding means, a bimetal element having a pair of opposite side mounted in said one housing with one of said opposite sides thereof adjacent said heating coil, first and second movable electrical contacts disposed on said one side of said bimetal element for circuit making and breaking engagement with said first and second stationary contacts, respectively, a third terminal disposed in locating engagement between said one housing and the other of said housings including a portion interiorly of said housings spaced adjacent to the other of said opposite sides of said bimetal element, an off-set in said interior portion of said third terminal, an opening in said off-set communicating with said other opposite side of said bimetal element, a PTCR disposed in said off-set in both supported engagement and electrical contacting engagement therewith, a fourth terminal disposed in locating engagement with at least said other housing including a portion interiorly of said other housing, said interior portion of the fourth terminal being engaged with at least a portion of said other housing and urged thereby into both supporting engagement and electrical contacting engagement with said PTCR, said third and fourth terminals being adapted for connecting the auxiliary winding means to the power source, said PTCR being self-heating in response to current flowing therethrough wherein the resistance of said PTCR increases generally as a function of its temperature for generally impeding current flow through said PTCR to the auxiliary winding means, said bimetal element being operable generally in response to heat it generates and to heat readiated thereto from said heating coil in the event of a current overload condition to break said first and second movable contacts from said first and second stationary contacts thereby to open the circuit between the power source and both the auxiliary winding means and the main winding means, and the heat of said PTCR being for the most part radiated and at least some such radiated heat being directed through said opening in said third terminal to said bimetal element to supplement the heat generated in said bimetal element and the heat radiated thereto from said heating coil for effectively delaying return of said first and second movable contacts by said bimetal element into uninterrupted making engagement with said first and second stationary contacts upon the cooling of said bimetal element for at least a period predeterminately long enough to allow said PTCR to cool to a temperature wherein the resistance thereof will permit current flow therethrough to the auxiliary winding means at a value great enough for restarting of the dynamoelectric machine.

25. A method of protecting auxiliary winding means and main winding means in a winding circuit of a dynamoelectric machine in the event of a current overload thereof comprising the steps of:

(a) actuating a bimetal switch responsive to a preselected thermal condition accompanying the current overload for interrupting the winding circuit to both the auxiliary winding means and the main winding means; and (b) transmitting heat from means for controlling starting of the dynamoelectric machine to the bimetal switch for maintaining the circuit effectively interrupted for at least a predetermined period, the starting controlling means being energized in response to current flow therethrough to increase its resistance generally as a function of its temperature for impeding the current flow therethrought to the auxiliary winding means generally at a preselected speed of the dynamoelectric machine.

26. A method as set forth in claim 25 comprising the additional step of reenergizing the starting controlling means momentarily in the event the bimetal switch momentarily cycles to a position completing the winding circuit during the occurrence of the current overload so that heat is transferred to the bimetal switch to supplement its thermal actuation upon the reenergization of the starting controlling means.

27. A method of protecting auxiliary winding means and main winding means in a winding circuit of a dynamoelectric machine in the event of a current overload thereof comprising the steps of:

(a) providing in a housing means for controlling starting of the dynamoelectric machine and means for generating heat at least during the current overload respectively disposed in heat transfer relation with a pair of opposite sides of a bimetal switch actuator adapted for movement between a circuit opening position and a circuit closing position in the housing for respectively interrupting and making the winding circuit to both the auxiliary winding means and the main winding means and mounting with the housing means for connecting the starting controlling means in circuit relation with the auxiliary winding means and for supporting the starting controlling means closely adjacent one of the opposite sides of the bimetal switch actuator;

(b) actuating the bimetal switch actuator in response to at least the heat transferred thereto from the heat generating means upon the occurrence of the current overload to effect the movement of the bimetal switch actuator toward its circuit opening position; and (c) transmitting heat from the starting controlling means to the bimetal switch actuator for generally maintaining the winding circuit effectively interrupted for at least a predetermined period, the starting controlling means being operable generally in response to current flow therethrough to increase its resistance generally as a function of its temperature for impeding the current flow therethrough to the auxiliary winding means generally at a preselected speed of the dynamoelectric machine.

28. A method of operating a dynamoelectric machine having a winding circuit adapted for energization across a power source and including main winding means and auxiliary winding means with the auxiliary winding means associated with means for controlling the energization thereof and with the winding circuit associated with means for protecting it in the event of the occurrence of a current overload, the method comprising the steps of:

(a) starting the dynamoelectric machine by energizing the winding circuit across the power source with the energization controlling means being energized in response to current flow therethrough to increase its resistance as a function of its temperature and impede the current flow therethrough to the auxiliary winding means generally at a preselected running speed of the dynamoelectric machine;

(b) actuating the protecting means in response to a preselected thermal condition accompanying the current overload upon the occurrence thereof from a first position effecting the energization of the winding circuit to another position interrupting the energization of the winding circuit and also the energization of the energization controlling means; and (c) momentarily reenergizing the energization controlling means to generate heat acting to supplement the thermal actuation of the protecting means and effect the reactuation thereof to the another position in the event the protecting means momentarily cycles from its another position to its first position during the occurrence of the current overload.

29. A combination starter-protector device adapted to be connected in circuit relation with a winding circuit of a dynamoelectric machine energized across a power source, the device comprising:

a housing having a plurality of wall means defining in said housing a chamber;

a pair of apertures extending through one of said wall means of said wall means plurality and communicating with said chamber;

means movable in said chamber in response to a preselected thermal condition for interrupting energization of the winding circuit in the event of the occurrence of a winding circuit overload;

means in said chamber for controlling starting of the dynamoelectric machine and operable generally upon the energization of the winding circuit to generate heat and transmit the heat to said interrupting means so as to delay the return movement thereof to a generally uninterrupted position effectively energizing the winding circuit; and a pair of terminal means mounted with said housing respectively including means disposed in said apertures for connecting said starting controlling means in the circuit relation with the winding circuit, and means in said chamber associated with said connecting means for electrical contacting and supporting engagement with said starting controlling means so as to position it in spaced relation adjacent said interrupting means in heat transfer relation therewith.

30. A combination starter-protector device as set forth in claim 29 wherein said electrical contacting and supporting engagement means of at least one of said terminal means includes a recess in which at least a portion of said starting controlling means is received.

31. A combination starter-protector device as set forth in claim 29 wherein said electrical contacting and supporting engagement means of at least one of said terminal means includes at least one opening for the passage therethrough of the heat transmitted from said starting controlling means toward said interrupting means.

32. A combination starter-protector device as set forth in claim 29 wherein said electrical contacting and supporting engagement means of at least one of said terminal means includes a side wall, and a base wall integral with said side wall and disposed in the electrical contacting and supporting engagement with a confronting portion of said starting controlling means.

33. A combination starter-protector device as set forth in claim 32 wherein electrical contacting and supporting engagement means of said at least one terminal means further includes an opening through said base wall for passing the heat transmitted from said starting controlling means to said interrupting means.

34. A combination starter-protector device as set forth in claim 29 wherein said starting controlling means comprises a PTCR.

35. A combination starter-protector device as set forth in claim 29 wherein said electrical contacting and supporting engagement means of one of said terminal means includes a plurality of fingers disposed in both the electrical contacting and supporting engagements with a confronting portion of said starting controlling means.

36. A combination starter-protector device as set forth in claim 29 wherein at least one of said terminal means further includes means for locating engagement with said one wall means so as to maintain said at least one terminal means generally in a predetermined mounted position in said chamber.

37. A combination starter-protector device as set forth in claim 29 wherein said interrupting means comprises a current overload protecting switch means including a bimetal element.

38. A combination starter-protector device as set forth in claim 29 wherein said interrupting means includes at least one terminal extending through another of said wall means of said wall means plurality adjacent said interrupting means, said interrupting means being movable in response to the preselected thermal condition from an at-rest position in making engagement with said at least one terminal toward a winding circuit energization interrupting position disengaged from said at least one terminal.

39. A combination starter-protector device as set forth in claim 29 wherein said starting controlling means comprises a PTCR.

40. A combination starter-protector device as set forth in claim 39 wherein said PTCR includes a pair of opposite electrical contact portions respectively associated with said electrical contacting and supporting engagement means of said terminal means.

41. A combination starter-protector device adapted to be connected in circuit relation with main winding means and auxiliary winding means of a winding circuit for a dynamoelectric machine comprising:
 a housing having a generally enclosed chamber therein;
 means mounted to said housing within said chamber and adapted to be actuated in response to a preselected thermal condition accompanying a current overload of the winding circuit from a winding circuit energizing position to another position for electrically isolating the winding circuit upon the occurrence of the current overload;
 means operable generally to increase its resistance as a function of its temperature in response to current flow in the circuit for controlling energization of the auxiliary winding means and mounted within said chamber in adjacent spaced relation with respect to said isolating means so as to effect heat transfer from said energization controlling mens to said isolating means supplementing the thermal actuation thereof to delay the generally uninterrupted return of said isolating means from its another position to its winding circuit energizing position; and
 terminal means engaged with said housing for supporting said energization controlling means in said chamber in the adjacent spaced relation with respect to said isolating means and extending from said chamber at least in part through said housing for connection in the circuit relation with the winding circuit.

42. A combination starter-protector device as set forth in claim 41 wherein said isolating means comprises switch means movable in response to the preselected thermal condition from the winding circuit energizing position to the another position.

43. A combination starter-protector device as set forth in claim 41 wherein said isolating means includes at least one terminal extending through said housing and having a portion interiorly of said chamber for engagement with said isolating means in the winding circuit energizing position thereof and an electrical connection portion exteriorly of said housing.

44. A combination starter-protector device as set forth in claim 41 wherein said energization effecting means comprises a PTCR having an electrical contact portion engaged with said terminal means within said chamber.

45. A combination starter-protector device as set forth in claim 41 further comprising another terminal means disposed in said chamber generally in opposed relation with said first named terminal means and engaged with said energization controlling means, said another terminal means extending from said chamber at least in part through said housing for connection in the circuit relation with the winding circuit.

46. A combination starter-protector device for connection with a dynamoelectric machine winding circuit adapted for energization across a power source, the device comprising a housing having a chamber therein, thermally responsive current carrying switch means for protecting the winding circuit against a current overload thereof and mounted in said chamber, said switch means including at least one terminal extending from said chamber through a part of said housing and adapted for connection with the power source, a temperature responsive resistance member having a pair of opposite contact portions and mounted within said chamber in predetermined spaced relation and heat transfer relation with said switch means, and a pair of terminal means for respective association with said temperature responsive resistance member and said housing, one of said terminal means including means engaged with another part of said housing spaced from said first named part thereof and disposed in both supporting engagement and electrical contacting engagement with one of said opposite contacting portions of said temperature responsive resistance member for mounting it within said chamber in the predetermined spaced relation and the heat transfer relation with said switch means, the other of said terminal means including means within said chamber and disposed at least in electrical contacting engagement with the other of said opposite portions of said temperature responsive resistance member for mounting it within said chamber, and said one and other terminal means respectively including means associated with said mounting means and extending from said chamber at least in part through said housing for connecting said temperature responsive resistance member with the winding circuit.

47. A combination starter-protector device for a dynamoelectric machine having auxiliary winding means and main winding means connected in a winding circuit adapted for energization across a power source, the device comprising a pair of separable housings, means for securing said housings against separation, a chamber within said housings, means for protecting the winding circuit in the event of a current overload when the winding circuit is energized across the power source including switch means in said chamber actuated in response to a preselected thermal condition accompanying the current overload upon the establishment thereof for interrupting the energization of both the auxiliary winding means and the main winding means and operable generally to reestablish the energization of both the auxiliary winding means and the main winding means upon the termination of the current overload, means in said chamber for controlling energization of the auxiliary winding means and said energization controlling means having a characteristic of increasing its resistance generaly as a function of its temperature in response to current flow therethrough so as to impede the current flow therethrough to the auxiliary winding means generally at a predetermined running speed of the dynamoelectric machine upon the energization of the winding circuit, a pair of means extending from said chamber at least in part through said housing for respectively connecting said energization controlling means with the winding circuit, and a pair of means formed with said connecting means and disposed within said chamber in electrical contacting engagement with said energization controlling means for mounting it within said chamber in spaced apart relation with respect to said switch means and adjacent thereto, said energization controlling means being energized at least momentarily in the event of the establishment of the current overload so as to surrender at least a portion of its heat to said switch means supplementing its thermal actuation to generally maintain the winding circuit effectively deenergized in the event said switch means momentarily reenergizes the winding circuit during the occurrence of the current overload.

48. A circuit adapted to be energized across a source of power comprising auxiliary winding means and main winding means connected in a winding circuit of a dynamoelectric machine and adapted for energization across the power source to operate said dynamoelectric machine generally at a preselected running speed therefor, means having a characteristic when energized of varying its resistance generally as a function of its temperature in response to current applied thereto and operable generally for impeding current flow therethrough to the auxiliary winding means generally at the preselected running speed of said dynamoelectric machine, means in circuit relation with said winding circuit for protecting it in the event of the occurrence of a current overload, said protecting means including means operable generally in an at-rest position to complete the circuit to said winding circuit upon the energization thereof and movable in response to a preselected thermal condition accompanying the current overload upon the occurrence thereof toward another position for interrupting the energization of said winding circuit so as to protect said auxiliary winding means and said main winding means, housing means for enclosing both said impeding means and said interrupting means, said housing means including terminal means for connecting said impeding means in circuit relation with said auxiliary winding means and for mounting said impeding means within said housing means closely adjacent and in heat transfer relation with said interrupting means so that the heat generated by said impeding means when it is energized is transferred to said interrupting means in order to assist in the heat responsive movement thereof to its another position in the event said interrupting means momentarily cycles to its at-rest position momentarily completing said winding circuit during the occurrence of the current overload.

49. A combination starter-protector device as set forth in claim 15 wherein said connecting and supporting means includes means extending at least in part through said at least another wall means and adapted for electrical connection to the dynamoelectric machine.

50. A combination starter-protector device as set forth in claim 49 wherein said electrical and supporting engagement means of said at least one terminal further includes an opening connecting with said recess for the passage therethrough of the heat transmitted from said starting controlling means toward said interrupting means.

51. A combination starter-protector device as set forth in claim 49 wherein said electrical and supporting engagement means of said at least one terminal further includes a side wall, and a base wall integral with said side wall and disposed in both the electrical and supporting engagements with at least a confronting portion of said starting controlling means, said recess generally comprising said side wall and said base wall.

52. A combination starter-protector device as set forth in claim 51 wherein said electrical and supporting engagement means of said at least one terminal further includes an opening through said base wall for passing the heat transmitted from said starting controlling means to said interrupting means.

53. A combination starter-protector device as set forth in claim 51 wherein said starting controlling means comprises a PTCR having a peripheral portion interposed between a pair of opposite end portions, said peripheral portion being disposed at least adjacent said side wall, and one of said opposite end portions comprising said confronting portion and being received in both the electrical and supporting engagements on said base wall.

54. A combination starter-protector device as set forth in claim 49 wherein said electrical and supporting engagement means of the other of said terminals includes a plurality of fingers disposed in both the electrical and supporting engagements with a confronting portion of said starting controlling means to retain it in said recess.

55. A combination starter-protector device adapted to be connected in a circuit with winding means of a dynamoelectric machine, the device comprising:
a housing;
means movable in said housing in response to a preselected thermal condition for interrupting the circuit in the event of winding means overload;
means for controlling starting of the dynamoelectric machine and operable generally to transmit heat to said interrupting means to delay movement thereof to an uninterrupted position effectively completing the circuit; and a pair of terminals mounted with said housing respectively including means for connecting said starting controlling means in the circuit, means interiorly of said housing for electrical and supporting engagement with said starting controlling means so as to position it closely adjacent said interrupting means in heat transfer relation therewith, and means for locating engagement with said housing to maintain said terminals generally in predetermined mounted positions in said housing.

56. A combination starter-protector device adapted to be connected in circuit relation with a winding circuit of a dynamoelectric machine, the device comprising:

a housing;

switch means within said housing actuated generally in response to a preselected thermal condition toward a position for interrupting the winding circuit in the event of a current overload and in response to cooling toward another position for completing the winding circuit;

means disposed within said housing for controlling starting of the dynamoelectric machine and operable generally to transmit heat to said switch means supplementing its thermal actuation so as to delay its cooling actuation toward its another position; and means mounted to said housing for connecting said starting controlling means in the circuit relation with the winding circuit and for predeterminately supporting said starting controlling means within said housing generally closely adjacent said switch means in heat transferring relation therewith and electrically isolated therefrom, said connecting and supporting means including a recess in which at least a portion of said starting controlling means is disposed.

57. A combination starter-protector device as set forth in claim 56 wherein said connecting and supporting means further includes an opening associated with said recess for passing heat from said starting controlling means toward said switch means.

* * * * *

UNITED STATES PATENT AND TRADEMARK OFFICE
CERTIFICATE OF CORRECTION

PATENT NO. : 4,084,202
DATED : April 11, 1978
INVENTOR(S) : Donald H. Stoll

It is certified that error appears in the above-identified patent and that said Letters Patent are hereby corrected as shown below:

Col. 2, line 40, after "methods" insert --,-- (comma);
      line 43, delete the "," (comma) and insert a --;-- (a semicolon).
Col. 4, line 65, after "bimetal" insert --disc--.
Col. 5, line 37, delete "5".
Col. 6, line 52, delete "27a" and insert --27--.
Col. 7, line 66, delete ""of-time"" and insert --"off-time"--.
Col. 8, line 50, delete "or" and insert --of--;
      line 65, after "openings" delete the "," (comma).
Col. 9, line 67, after "dimples" insert --95--;
      line 67, delete "the".
Col. 11, line 32, delete "displacements" and insert --displacement--;
      line 49, after "," (comma)(second occurrence) insert --of--.
Col. 12, line 39, delete "im-";
      line 40, delete "pede or";
      line 41, after "generally" insert --impede or--.
Col. 18, line 7, delete "run";
      line 16, delete "side" and insert --sides--.
Col. 22, line 3, delete "mens" and insert --means--.
Col. 23, line 27, delete "generaly" and insert --generally--.

Signed and Sealed this

Twenty-first Day of November 1978

[SEAL]

Attest:

RUTH C. MASON
*Attesting Officer*

DONALD W. BANNER
*Commissioner of Patents and Trademarks*